US012784865B2

(12) United States Patent
Schreiber

(10) Patent No.: US 12,784,865 B2
(45) Date of Patent: Nov. 3, 2026

(54) APPARATUSES, SYSTEMS, AND METHODS FOR SIGNAL REDUNDANCY IN STACKED-CHIP ARCHITECTURES

(71) Applicant: Advanced Micro Devices, Inc., Santa Clara, CA (US)

(72) Inventor: Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 223 days.

(21) Appl. No.: 18/611,580

(22) Filed: Mar. 20, 2024

(65) Prior Publication Data

US 2025/0299764 A1 Sep. 25, 2025

(51) Int. Cl.
*G11C 29/52* (2006.01)
*G11C 29/00* (2006.01)
*H10D 88/00* (2025.01)
*H10W 20/20* (2026.01)

(52) U.S. Cl.
CPC ............ *G11C 29/52* (2013.01); *G11C 29/802* (2013.01); *H10D 88/00* (2025.01); *H10W 20/20* (2026.01)

(58) Field of Classification Search
CPC ..... G11C 29/52; G11C 29/802; H01L 23/481; H10D 88/00
USPC .......................................................... 365/185
See application file for complete search history.

(56) References Cited

U.S. PATENT DOCUMENTS

2008/0184057 A1* 7/2008 Thorp .................. G11C 29/802 714/1
2017/0110206 A1* 4/2017 Ryu ................... G11C 29/4401
2022/0308892 A1* 9/2022 Colombo .............. G06F 9/4403

* cited by examiner

*Primary Examiner* — Amir Zarabian
*Assistant Examiner* — Minh Dinh
(74) *Attorney, Agent, or Firm* — Greenberg Traurig, LLP

(57) ABSTRACT

Systems and devices for signal redundancy in stacked chip architectures can include an integrated circuit that incorporates a voting circuit. The voting circuit can be configured to receive multiple redundant copies of a signal input and remedy faults in a transmission pathway of the signal input by producing a signal output that reflects a majority among received versions of the signal input.

20 Claims, 7 Drawing Sheets

APPARATUSES, SYSTEMS, AND METHODS FOR SIGNAL REDUNDANCY IN STACKED-CHIP ARCHITECTURES

BACKGROUND

Some examples of microprocessors use multiple layers of silicon in a stacked arrangement to produce a three-dimensional integrated circuit (3D IC). These chips transfer data between layers through vertical interconnects, such as through-silicon vias (TSVs) to connect circuits on opposite sides of a silicon layer and/or through direct electrical connections to connect circuits on facing sides of adjoining silicon layers. As with traditional 2D chip architectures, some implementations of 3D ICs use configurable fuse data to configure the chip for use on startup as well as other signals (such as JTAG, reset and POR) to facilitate proper booting.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
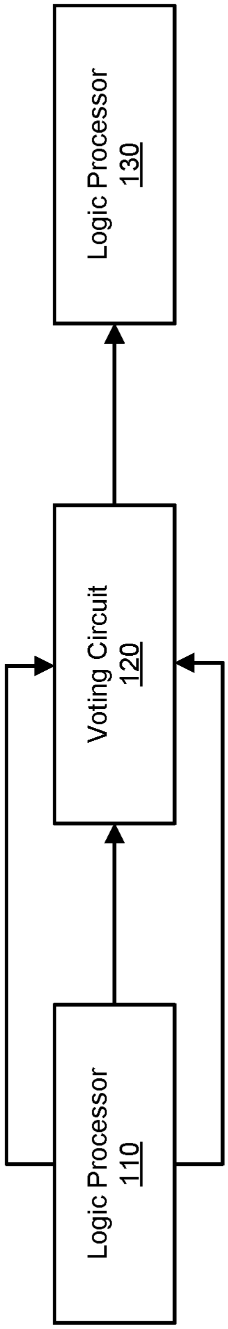
FIG. 1 is a block diagram of an example system for signal redundancy in stacked chip architectures.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to signal redundancy in stacked-chip architectures, or three-dimensional integrated circuits (3D ICs). Manufacturing of 3D ICs is imperfect, and chip stacks can have flaws that prevent signals from properly being transmitted between layers. Additionally, connections between chip faces and/or chip layers develop faults over time. These faults can break an electrical connection (open-circuit faults) or short-circuit an electrical connection (short-circuit faults). Open circuit faults can prevent signals from traversing the signal pathway thus resulting in an unanchored voltage at the receiving end of the signal pathway, while short-circuit faults can register in a variety of ways depending on if the short is to power, ground or a signal. Regardless of the fault type, a faulted signal circuit no longer properly transfers data. Some chip architectures solve this problem with secondary fail-over pathways that operate parallel to the primary signaling pathway, and these chips can be configured to use the fail-over transmission pathway in the event that the primary pathway suffers a fault. However, traditional fail-over schemes such as shifting redundant signal schemes rely on distribution of fuse data to configure the chip to use the backup pathway, making such backup circuits unsuitable for signals that must be correct at power-on before fuse or chip configuration data is distributed.

As will be described in greater detail below, adding multiple channels or physical pathways of signal redundancy that feed into a voting circuit situated on the other side of a potential structural failure point from the signal source. The voting circuit can combine the redundant signals into a single usable output that can address both open-circuit faults as well as short-circuit faults, providing chips with a level of resilience against these faults that correlates with the number of channels of redundancy. These redundant/voting circuits can be especially useful in ensuring that essential signals that must be correct at time-zero or power-on before fuse data is propagated into the chip are able to be transmitted properly between chip layers even in the presence of faults, regardless of whether the fault is an open-circuit or short-circuit fault. Additionally, because the signal redundancy is implemented at the hardware level, voting circuits can be implemented in any multi-chip architecture (including stacked-chip architectures) regardless of other design features that might be present. Although the example voting circuitry described herein involves three bits of redundancy, voting circuits can be expanded to provide any arbitrary level of redundancy (e.g., 5, 8, 9, or any number of bits of redundancy) at the cost of increasing the physical space required to implement the redundant transmission pathways and the transmission time overhead required to transmit and process the redundant signals through the voting circuit. Although the examples provided herein are primarily discussed with respect to stacked-chip architectures and 3D ICs, voting circuits can be used to provide signal redundancy and resilience against faults in any signaling pathway where electrical faults are expected to occur such as in interposer based designs.

Figure 2:
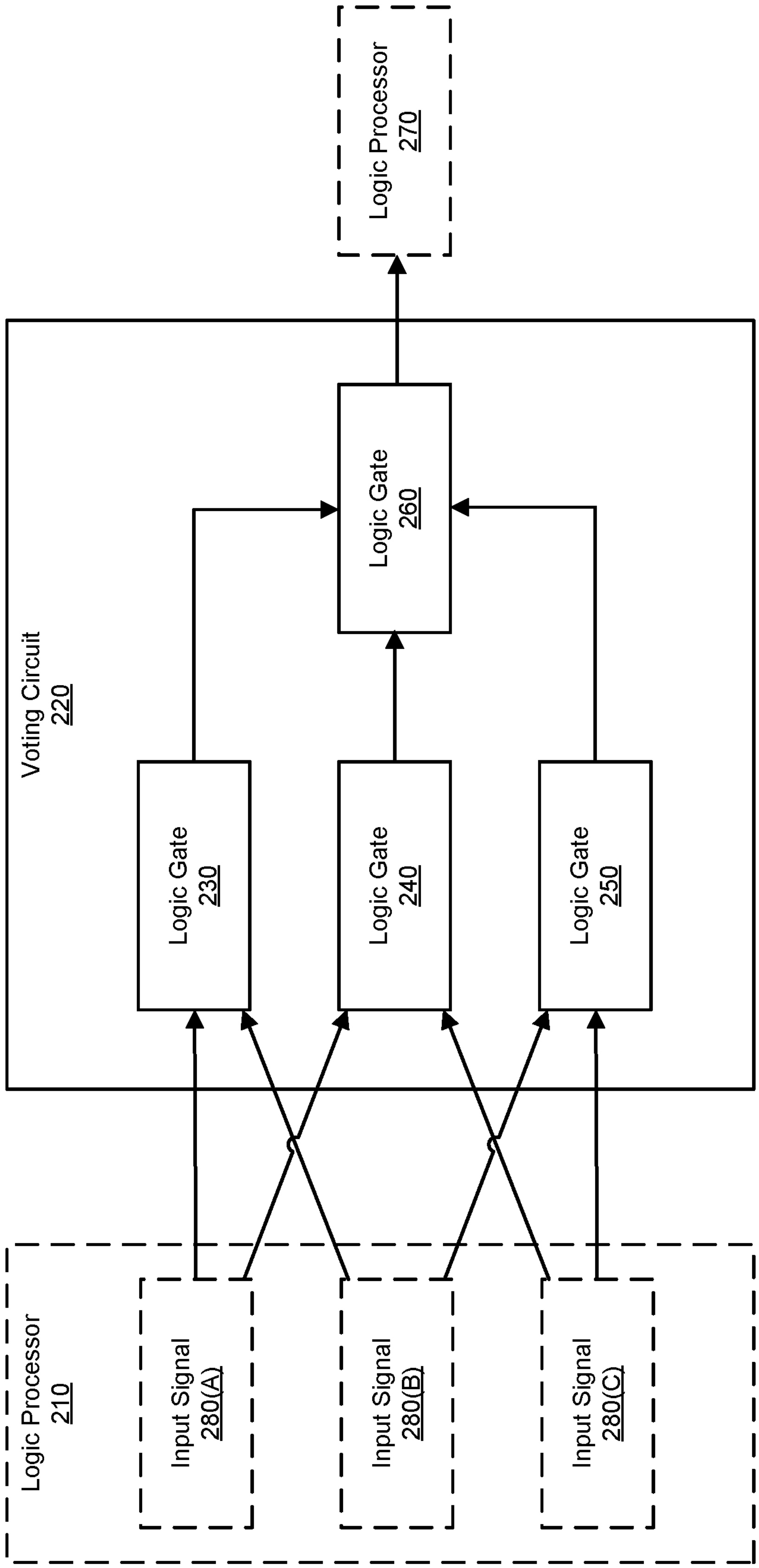
FIG. 2 is an additional block diagram of an example system for signal redundancy in stacked chip architectures.

The following will provide, with reference to FIGS. 1-2, detailed descriptions of example systems for signal redundancy in stacked chip architectures. Detailed descriptions of various failures and how the voting circuits described herein remedy these faults will be provided in connection with FIGS. 3-4, and detailed descriptions of an example system expanded to include an arbitrary level of signal redundancy will be described in connection with FIG. 5. Detailed descriptions of corresponding methods will also be provided in connection with FIG. 6.

A device that provides signal redundancy in stacked chip architectures can include a voting circuit that is configured to receive multiple redundant copies of a signal input and remedy faults in a transmission pathway of the signal input by producing a signal output that reflects a majority among received versions of the plurality of redundant copies of the signal input. In some examples, the integrated circuit can be a three-dimensional integrated circuit. In these examples, the voting circuit can be positioned adjacent to a through-silicon via (TSV) and remedy faults in the TSV. Additionally or alternatively, the voting circuit can be positioned adjacent to a cross-layer connection between adjacent layers of the three-dimensional integrated circuit and remedy faults in the cross-layer connection.

In some examples, the voting circuit can receive three redundant copies of the signal input. In these embodiments, the voting circuit can include a first layer made up of three NAND gates that receive sub-combinations of the three redundant copies of the signal input as inputs according to an AB, BC, AC scheme. The voting circuit can also include a second layer made up of one NAND gate that receives the outputs of the first layer as an input.

Voting circuits can be used to ensure the integrity of certain signals. For example, the signal input can be a signal that must be transmitted before the integrated circuit loads fuse data. Additionally or alternatively, the integrated circuit can require the signal to be correct at power-on. Specific examples of the signal include (i) a system reset signal, (ii) a power-on/reset (POR) signal, or (iii) a JTAG signal.

The voting circuit can remedy different fault types in the integrated circuit. For example, the voting circuit can repair an open circuit fault in the transmission pathway of the signal input. Additionally or alternatively, the voting circuit can repair a short-circuit fault in the transmission pathway of the signal input.

A system for ensuring signal integrity in stacked chip architectures can include an integrated circuit that itself includes a voting circuit. As described above, the voting circuit can be configured to receive multiple redundant copies of a signal input and remedy faults in a transmission pathway of the signal input by producing a signal output that reflects a majority among received versions of the redundant copies of the signal input. The system can also include a physical memory that stores an output of the integrated circuit.

A method for ensuring signal integrity in stacked chip architectures can include (i) transmitting, from a source logic unit, multiple redundant copies of a signal input to a voting circuit that is configured to (a) receive the redundant copies of the signal input, and (b) remedy electrical faults in a transmission pathway of the signal input by producing a signal output that reflects a majority among received versions of the signal input, and (ii) receiving, at a destination logic unit, the from the voting circuit.

FIG. 1 is a block diagram showing an example structure of two logic processors in communication with each other and an intervening voting circuit to establish signal redundancy for communications from one logic processor to the other. As illustrated in FIG. 1, a logic processor 110 can send three identical or redundant signals over separate physical transmission pathways to voting circuit 120. These separate physical pathways can be arranged in any suitable way to ensure that a failure in one transmission pathway does not necessarily affect the other two transmission pathways.

In the example of a stacked chip architecture, the signal pathways between logic processor 110 and voting circuit 120 can cross the intervening gap between two layers of a chip, such as from one side of a layer of substrate to the other through a through-silicon-via (TSV) or across the connections between adjoining faces of the stacked chip integrated circuit. In embodiments where a layer of neutral silicon (i.e., silicon that is not etched, doped, or otherwise configured to perform computing functions and/or to conduct electrical current) or other insulating layer is used to separate layers of a 3D IC, TSVs or other vias can be formed through the insulating material to connect the different layers of the 3D IC. As explained above, these connections can fail as a result of manufacturing defects and/or ordinary wear and tear, thus corrupting signals transmitted from logic processor 110 to logic processor 130. However, voting circuit 120 can be positioned on the same layer as logic processor 130 (e.g., adjacent to the cross-layer connection and/or adjacent to logic processor 130), receive the redundant inputs, and process the redundant inputs into an output signal that reflects the majority of the received signals. Voting circuit 120 can then forward the output signal to logic processor 130. In some embodiments, voting circuit 120 can be positioned adjacent to the TSV or TSVs (or any other cross-layer connection of the stacked chip architecture) to remedy faults in the cross-layer connection pathways, thereby minimizing the physical surface area occupied by the redundant transmission pathways. Additionally or alternatively, a voting circuit can be positioned near the destination logic processor (i.e., logic processor 130) to ensure that faults in the signal pathways are remedied by the voting circuit and to reduce signal latency between the logic processor and voting circuit. Although the example of FIG. 1 shows three redundant signals, any suitable number of redundant input signals can be used. Additionally, and as mentioned above, the concepts described herein are not limited to stacked-chip architectures; voting circuits can be applied in any situation where there is a risk of transmission failure due to a faulted connection or signal transmission pathway.

As used herein, the term "integrated circuit," can generally refer to a set of electronic circuits. For example, and without limitation, an integrated circuit can be configured as a chip, microchip, and/or microelectronic circuit of communicatively coupled circuit elements in one or more semiconductor wafers. In this context, example circuit elements can correspond to resistors, capacitors, diodes, transistors, etc. Example circuit elements can be one or more logic transistors, one or more analog devices, and/or one or more features sets (e.g., static random access memory, fuses, temperature sensors, etc.). Integrated circuits can be constructed in a variety of ways, including using stacked chip architectures.

The term "stacked chip architecture" refers to integrated circuit designs that incorporate layers of silicon or other substrate that are stacked atop each other rather than lying side-by-side as in most traditional integrated circuit designs. These layers are electrically coupled to each other so that components on different layers of the integrated circuit can communicate with each other. Stacked chip architecture or die stacking allows more computing surface area to be packed into the same horizontal space and allows for an extra degree of freedom in positioning computing components for increased electrical and thermal efficiency. Some examples of integrated circuits that can benefit from stacked chip architectures include central processing units (CPUs), accelerator processing units (APUs), neural network processors (NNPs), application-specific integrated circuits (ASICs), other co-processing units and/or parallel processing units, combinations of one or more of the same, and the like.

The term "logic processor" as used herein refers to an integrated circuit, portion of an integrated circuit, or other digital processing component that can be addressed by an operating system to perform calculations. Logic processors send signals to other logic processors. In the example of a stacked chip architecture, logic processors might need to communicate with other portions of the integrated circuit that are on a different layer. These communications occur over physical connections that are sometimes referred to herein as "channels". In some examples, a physical connection can cross the intervening space between one chip layer and another. In other examples, a physical connection can cross an intervening space between two different chips, chip cores, or chip regions, and/or pass through an interposer. Regardless of the situation, a voting circuit can be applied to any transmission pathway where there is sufficient risk of electrical failure to necessitate signal redundancy.

The term "voting circuit" as used herein refers to an arrangement of binary logic gates connected such that an output of the voting circuit represents the majority of the inputs provided to the voting circuit. For example, and as will be described in greater detail below, a voting circuit that accepts three input bits (such as the voting circuit illustrated in FIGS. 1 and 2) will output a 1 bit if two or three of the input bits are 1 and will output a 0 bit if two or three of the input bits are 0. Although the examples discussed herein are primarily directed to a voting circuit that manages three bits of redundant signaling, a voting circuit can accept any number of input bits that are suitable for the design of the signal circuitry into which the voting circuit is incorporated. As described above, a voting circuit can remedy various faults in a signal transmission pathway. In the event that one of the data channels fails, then any data transmitted over that channel will be corrupted. As described above, open-circuit faults, short-circuit faults, and other issues with a transmission pathway can cause a failure in one of the data channels, rendering data transmitted over the channel unsuitable for use by the destination logic processor. However, so long as the other two channels do not suffer a fault, the voting circuit will output the combined result of the other two channels. Thus, a voting circuit that accepts three redundant inputs provides hardware-level resilience against one faulted channel. This concept can be expanded to any level of desired redundancy depending on a particular integrated circuit's sensitivity to signal faults in a given pathway. A voting circuit with five redundant inputs can provide hardware-level resilience against two faulted channels, a voting circuit with seven redundant inputs can provide resilience against three faulted channels, etc.

The term "redundant copy," as used herein, refers to a signal that provides data that is intended to be identical to another redundant copy of the signal. For example, redundant copies of a "1" bit would all be transmitted as a "1" bit, and redundant copies of a "0" bit would all be transmitted as a "0" bit. Redundant copies of data can be transferred over the same or different physical transmission pathways. The systems and methods described herein typically transmit several redundant copies of data over separate physical pathways. However, and as described above, interruptions, faults, or other defects in a transmission pathway (such as a gapped connection or an improperly soldered connection) can cause a received version of a redundant copy of a signal to be incorrect.

As may be appreciated from the above description, incorporation of a voting circuit into a signal pathway adds overhead in terms of physical space needed to provide the redundant inputs and overhead in terms of time needed to process the input signals into an output. However voting circuit 120 can nevertheless ensure that critical signals are properly forwarded to their destination before fuse data is distributed, regardless of an electrical fault in one of the transmission channels between logic processor 110 and voting circuit 120. Furthermore, although the descriptions and drawings provided herein show a voting circuit interposed between two logic processors, a voting circuit can be inserted in any suitable signal pathway that requires hardware-level signal redundancy and resilience against electrical faults.

FIG. 2 is a block diagram showing one possible configuration for a three-input voting circuit that accepts inputs in an AB, BC, AC scheme. In the example of FIG. 2, a logic processor 210 sends input signals 280(A), 280(B), and 280(C) over separate physical transmission pathways to voting circuit 220 (e.g., through separate TSVs through an insulating layer between logic processor 210 and voting circuit 220). Voting circuit 220 includes two layers of logic gates. The first layer, composed of logic gates 230, 240, and 250, accepts input signals 280(A), 280(B), and 280(C) according to the AB, BC, AC scheme as follows: logic gate 230 takes input signals 280(A) and 280(B) as inputs, logic gate 240 takes input signals 280(A) and 280(C) as inputs, and logic gate 250 takes input signals 280(B) and 280(C) as inputs. Logic gate 260 combines the outputs of logic gates 230, 240, and 250 into an output signal that is then transmitted to logic processor 270, which can be on the same chip layer as voting circuit 220 to minimize the risk of faults in the transmission pathway between voting circuit 220 and logic processor 270. Indeed, some chip architectures can ensure that logic processor 270 is physically proximate to voting circuit 220 to further reduce the risk of transmission failure, and/or improve thermal and/or electrical efficiency of the integrated circuit.

In some embodiments, a voting circuit can be implemented as a series of connected logic gates. For example, each logic gate of voting circuit 220 can be a NAND logic gate that outputs a 0 bit only if all inputs are 1 bits, and outputs a 1 bit otherwise. The particular arrangement of NAND logic gates illustrated in FIG. 2 ensures that the final output of the voting circuit will match whichever bit is represented on two or three of the inputs. Although this example uses NAND gates, many other arrangements of logic gates can be used to achieve similar voting circuit functionality and indeed may be necessary in situations involving more than three input channels. Table 1 below illustrates potential inputs to voting circuit 220 and the corresponding outputs. Although every possible input signal combination is represented, in most practical implementations of a voting circuit, channels that are not suffering faults will transmit the same bit.

TABLE 1

| Input signal 280(A) | Input signal 280(B) | Input signal 280(C) | Output |
|---|---|---|---|
| 0 | 0 | 0 | 0 |
| 1 | 0 | 0 | 0 |
| 0 | 1 | 0 | 0 |
| 1 | 1 | 0 | 1 |
| 0 | 0 | 1 | 0 |
| 1 | 0 | 1 | 1 |
| 0 | 1 | 1 | 1 |
| 1 | 1 | 1 | 1 |

Figure 3:
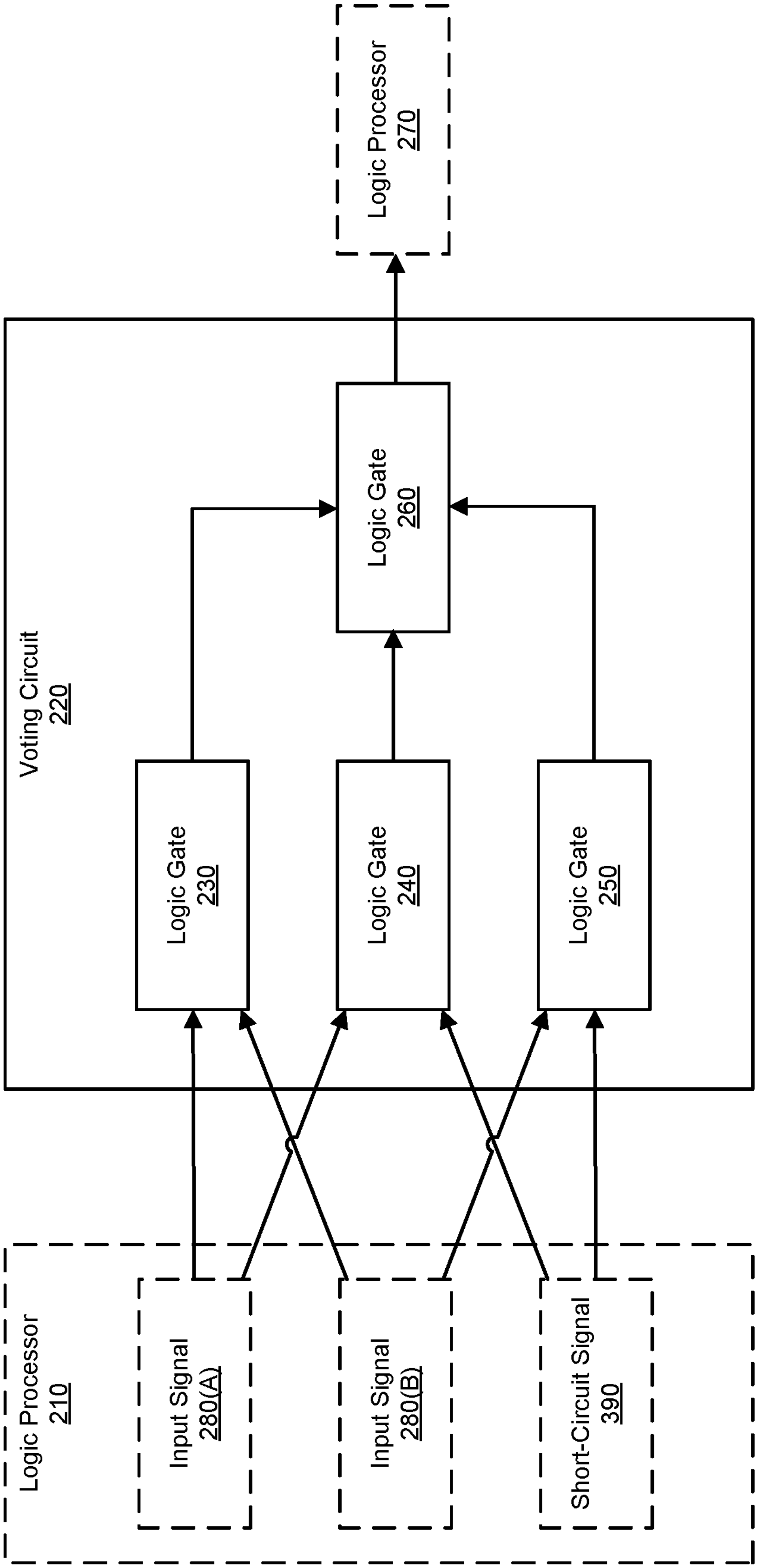
FIG. 3 is a block diagram illustrating how an example system for signal redundancy in stacked chip architectures might remedy a short-circuit failure.

FIG. 3 shows the same logic processors 210 and 270 with intervening voting circuit 220 as FIG. 2, but one of the transmission pathways for one of the input signals has suffered a short-circuit fault, thus converting input signal 280(C) as illustrated in FIG. 2 to short-circuit signal 390 in FIG. 3. As described above, a short circuit fault can cause incorrect electrical signals to erroneously flow through the transmission pathway depending on the nature of the short-circuit fault. However, voting circuit 220 can remedy this fault because input signals 280(A) and 280(B) are not being transmitted over faulted pathways and thus will cause the output of voting circuit 220 to match the uncorrupted signals. Table 2 below illustrates potential inputs (including the faulted channel) to voting circuit 220 and the corresponding outputs. Of particular note, the values of input signals 280(A) and 280(B) define the output of the voting circuit, regardless of the faulted third bit. Furthermore, and as explained above, input signals 280(A) and 280(B) will always be the same unless one of the pathways faults because they are redundant copies of the same signal being transmitted from logic processor 210 to logic processor 270.

TABLE 2

| Input signal 280(A) | Input signal 280(B) | Short-Circuit signal 390 | Output |
|---|---|---|---|
| 0 | 0 | Corrupted | 0 |
| 1 | 1 | Corrupted | 1 |

Figure 4:
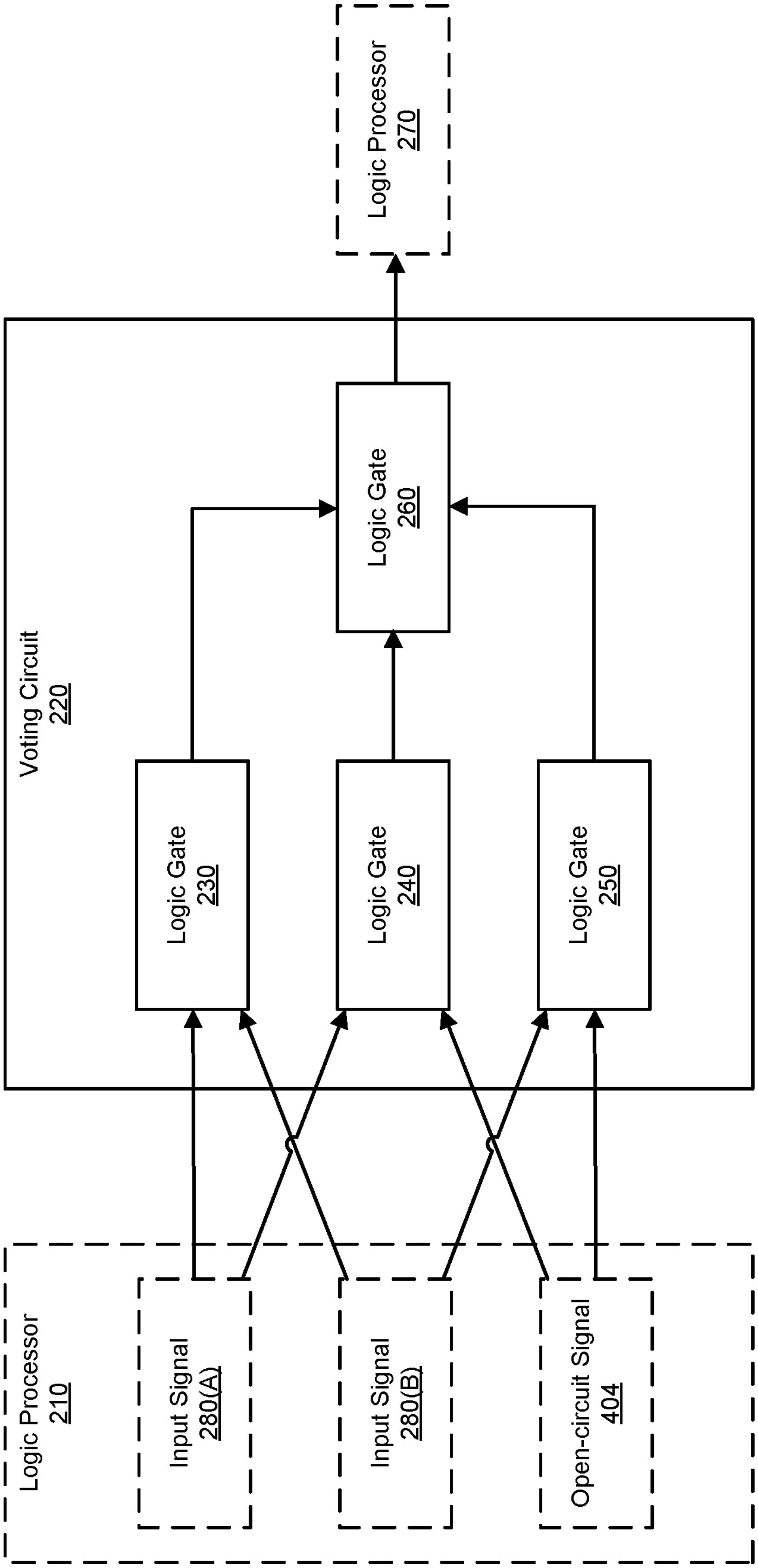
FIG. 4 is a block diagram illustrating how an example system for signal redundancy in stacked chip architectures might remedy an open-circuit failure.

FIG. 4 shows the same logic processors 210 and 270 with intervening voting circuit 220 as FIG. 2, but instead of the third input signal suffering a short-circuit fault, one of the transmission pathways for one of the input signals has suffered an open-circuit fault, thus converting input signal 280(C) to open-circuit signal 404 that causes all bits transmitted over that particular transmission pathway to be corrupted. However, as with short-circuit signal 390, voting circuit 220 can remedy open-circuit signal 404 based on the redundancy provided by input signals 280(A) and 280(B). Table 3 below illustrates potential inputs (including the faulted channel) to voting circuit 220 and the corresponding outputs. As before, input signals 280(A) and 280(B) define the output of voting circuit 220 regardless of the bit received over the faulted pathway.

TABLE 3

| Input signal 280(A) | Input signal 280(B) | Open-Circuit signal 404 | Output |
|---|---|---|---|
| 0 | 0 | Corrupted | 0 |
| 1 | 1 | Corrupted | 1 |

As can be appreciated from the examples of Table 2 and Table 3, the output of voting circuit 220 will match input signals 280(A) and 280(B) even if the third channel faults, regardless of the nature of the fault. Furthermore, because voting circuit 220 is implemented in hardware logic gates, voting circuit 220 can remedy these faults regardless of whether chip configuration and/or fuse data has been distributed to the chip thus allowing for redundant signal pathways for signals that must be correct at power-on, such as system reset signals, power-on/reset (POR) signals, and/or JTAG signals.

Figure 5:
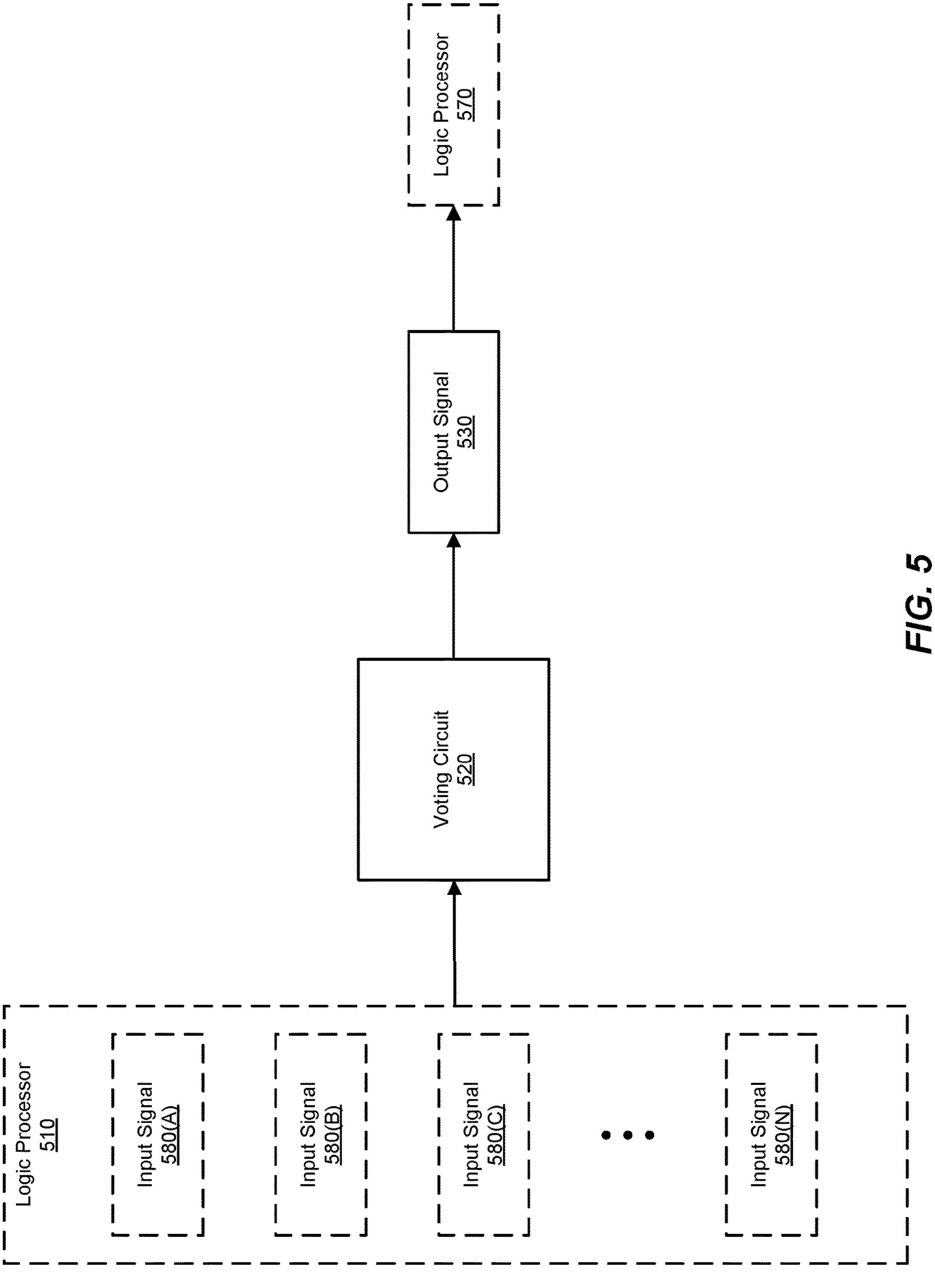
FIG. 5 is block diagram of an example system for an arbitrary level of signal redundancy in stacked chip architectures.

The principles described above can be expanded to any desirable level of redundancy in order to provide increasing levels of resilience against faults in the electrical connections between chip regions. FIG. 5 is a block diagram of an example system incorporating a voting circuit 520 and an arbitrary number of input signals, illustrated as input signals 580(A)-580(N). Each additional input signal passed to voting circuit 520 increases the overall resilience of the signal pathway at the cost of chip space and processing delays. For example, passing 5 redundant inputs to voting circuit 520 would generate an output signal 530 resilient against at least two faults, and passing 7 redundant inputs to voting circuit 520 would generate an output signal 530 resilient against at least 3 faults. As such, voting circuit 520 can ensure that the correct output signal 530 is passed from logic processor 510 to logic processor 570.

Figure 6:
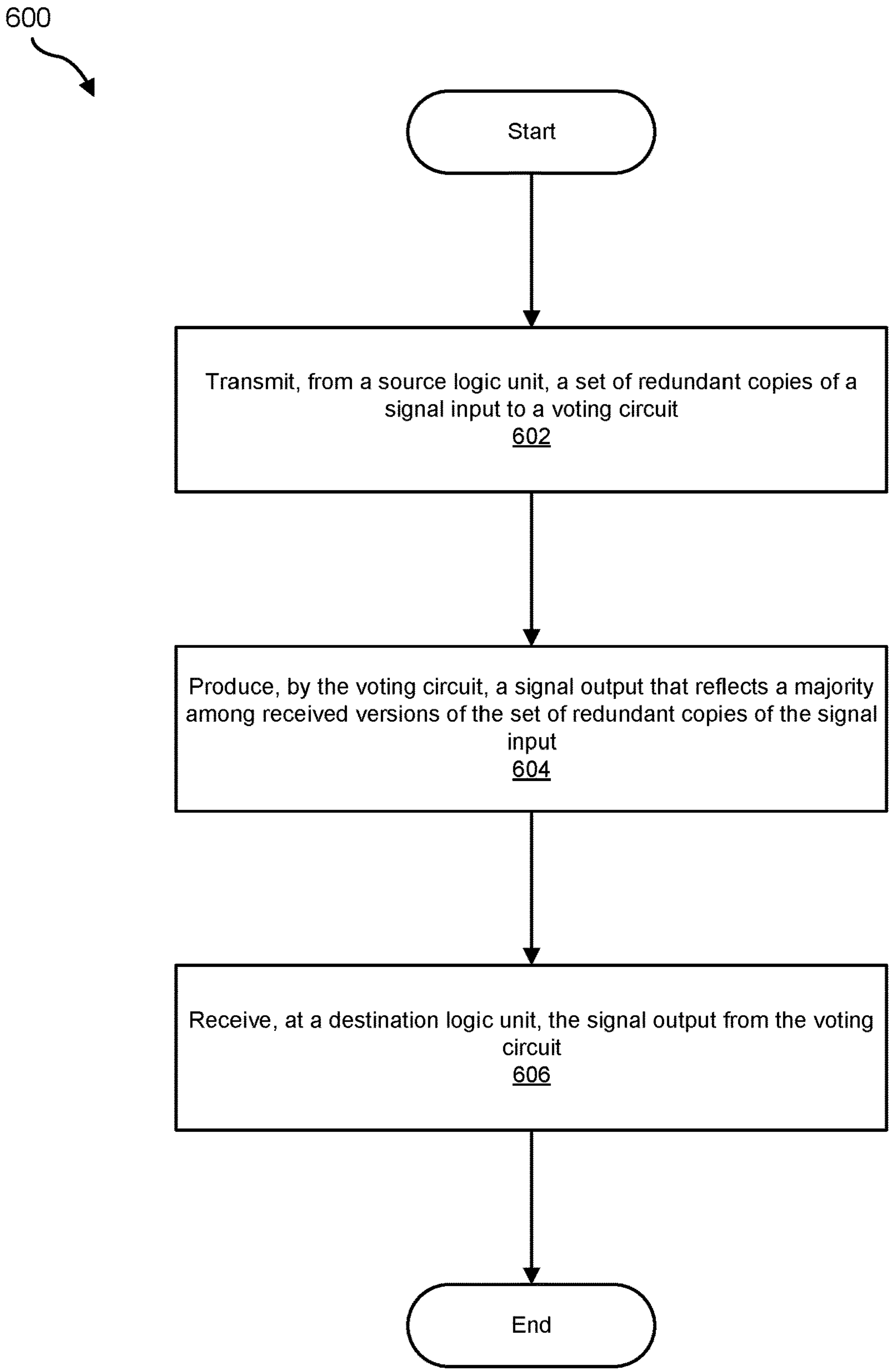
FIG. 6 is a block diagram of an example method for signal redundancy in stacked chip architectures.

FIG. 6 is a flow diagram of an example computer-implemented method 600 for providing signal redundancy in stacked chip architectures. The steps shown in FIG. 3 can be performed by any suitable computing hardware, including system 100 in FIG. 1, system 200 in FIG. 2, and/or variations or combinations of one or more of the same. In one example, each of the steps shown in FIG. 3 can represent an algorithm whose structure includes and/or is represented by multiple sub-steps, examples of which will be provided in greater detail below.

As illustrated in FIG. 6, at step 602 one or more of the systems described herein can transmit, from a source logic unit, a set of redundant copies of a signal input to a voting circuit. For example, and as described in greater detail above, a signal source (such as a logic processor) can transmit identical copies of a piece of data over multiple physical pathways to a voting circuit.

Next, at step 604, the voting circuit can then produce a signal output that reflects a majority among received versions of the redundant copies of the signal input to remedy faults in the transmission pathways. For example, and as described in greater detail above, the voting circuit can use a pyramidal arrangement of logic gates (such as NAND gates) to combine the received signals into the output. As described above, the received signals can differ from the data as originally transmitted due to faults in the transmission pathways.

At step 606, the destination logic unit receives the signal output from the voting circuit. As described above, the voting circuit can be positioned on the same side of a cross-layer connection as the destination logic unit and can transmit a single signal that reflects the majority of transmitted bits to the destination logic unit.

Figure 7:
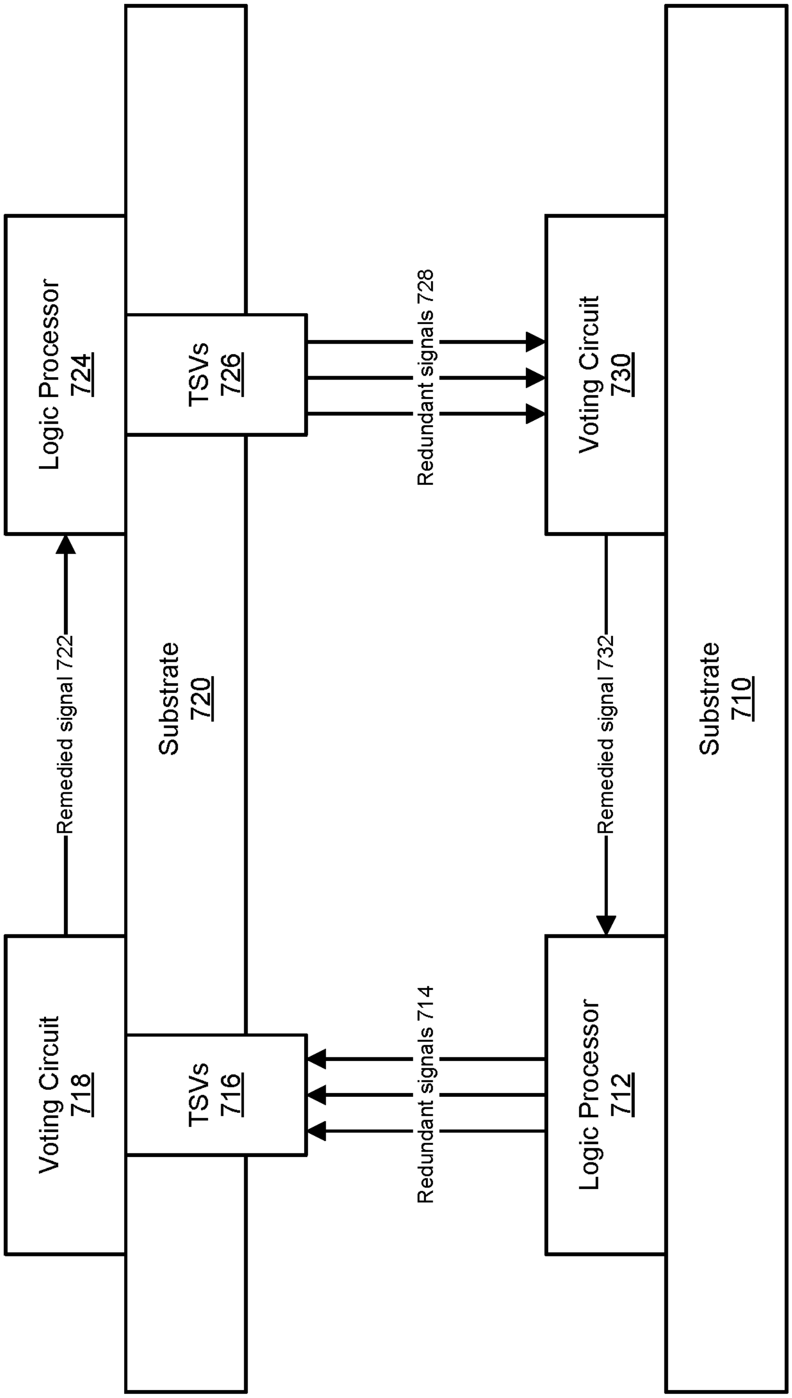
FIG. 7 is a side view schematic of an example simplified stacked-chip architecture that uses voting circuits to remedy potential signal faults.

In some embodiments, the voting circuits described above can be incorporated into a stacked-chip or three-dimensional integrated circuit in which multiple layers of substrate (such as silicon) are disposed atop each other and connected at specific points to pass signals between the layers. FIG. 7 is a side view schematic of an example three-dimensional integrated circuit in which a substrate 720 is stacked atop a substrate 710. Substrate 720 may incorporate through-silicon-vias (TSVs) 716 and 726 to facilitate the transfer of electrical signals through substrate 720. Although illustrated as single components, TSVs 716 (and likewise TSVs 726) are, in this example, collections of three TSVs each to facilitate redundant signal transfer. As may be appreciated from the above descriptions, TSVs 716 and 726 can incorporate any suitable number of TSVs, and likewise can be positioned wherever appropriate (e.g., at physically distinct locations on the substrate, such as spaced according to a particular minimum distance) to pass signals through substrate 720 instead of all clustered at approximately the same location. Substrate 720 also incorporates a voting circuit 718 that uses redundant signals 714 passed through TSVs 716 by logic processor 712 to produce remedied signal 722 that is tolerant of a fault in one of TSVs 716.

In this example flow, logic processor 712 generates a signal, then transmits it as redundant signals 714, i.e., in triplicate over three physical pathways through TSVs 716. The signal pathways that transmit redundant signals 714 may in some cases diverge close to the point where they leave substrate 710 and/or TSVs 716 to optimize the electrical and thermal efficiency of the overall integrated circuit.

In other cases, the signal pathways may depart from different regions of logic processor 712. Voting circuit 718 can receive redundant signals 714 and remedy a fault in one of the redundant signals, passing remedied signal 722 to logic processor 724 on substrate 720.

Similar concepts can be applied to signals being transmitted from a logic processor situated on substrate 720, as well. For example, logic processor 724 can pass redundant signals 728 (e.g., three redundant signals) through TSVs 726 to voting circuit 730, which in turn produces and passes remedied signal 732 to logic processor 712. In this manner, logic processors 712 and 724 can communicate with each other over fault-tolerant pathways despite being located on different layers of the three-dimensional integrated circuit. Other TSVs and signal pathways may exist in the three-dimensional circuit to transmit signals that do not require the same level of redundancy provided by the systems illustrated herein.

As described above, stacked chip architectures such as three-dimensional integrated circuits can suffer from faults in transmission pathways between processing regions on different chip surfaces, chip layers, or chiplets. Transmitting redundant copies of critical signals via separate physical pathways across the boundaries between chip layers can allow a voting circuit positioned on the destination chip layer or surface to remedy a fault in the connection between layers. Furthermore, because this fault remediation functionality is embedded in the integrated circuit at the hardware level, the voting circuit can remedy these faults even before chip configuration and/or fuse data is distributed and loaded.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
an integrated circuit comprising a voting circuit that is configured to:
receive a plurality of redundant copies of a signal input; and
remedy faults in a transmission pathway of the signal input by producing a signal output that reflects a majority among received versions of the plurality of redundant copies of the signal input,
wherein the voting circuit remedies faults in a cross-layer connection between adjacent layers of the integrated circuit.

2. The device of claim 1, wherein the integrated circuit comprises a three-dimensional integrated circuit.

3. The device of claim 2, wherein the voting circuit is positioned adjacent to a through-silicon via (TSV) and remedies faults in the TSV.

4. The device of claim 2, wherein:
the three-dimensional integrated circuit comprises a first substrate and a second substrate, the second substrate being disposed atop the first substrate;
the second substrate comprises a plurality of through-silicon vias (TSVs) that are configured to transmit signals through the second substrate;
the three-dimensional integrated circuit further comprises a first logic processor disposed on the first substrate, and a second logic processor disposed on the second substrate, the first logic processor being configured to transmit signals to the voting circuit by the plurality of TSVs; and
the voting circuit is disposed on the second substrate and is configured to:
receive signals from the first logic processor by the plurality of TSVs; and
transmit the signal output to the second logic processor.

5. The device of claim 1, wherein the plurality of redundant copies comprises three redundant copies of the signal input.

6. The device of claim 1, wherein the voting circuit comprises:
a first layer comprising three NAND gates that receive sub-combinations of the three redundant copies of the signal input as inputs according to an AB, BC, AC scheme;
a second layer comprising one NAND gate that receives the outputs of the first layer as an input; and
an output that outputs a result of the voting circuit.

7. The device of claim 1, wherein the signal input is transmitted before the integrated circuit loads fuse data.

8. The device of claim 7, wherein the signal input comprises at least one of:
a system reset signal;
a power-on/reset signal; or
a JTAG signal.

9. The device of claim 1, wherein the integrated circuit requires the signal input to be correct at power-on.

10. The device of claim 1, wherein the voting circuit repairs an open circuit fault in the transmission pathway of the signal input.

11. The device of claim 1, wherein the voting circuit repairs a short-circuit fault in the transmission pathway of the signal input.

12. The device of claim 1, wherein the cross-layer connection passes through an interposer within the integrated circuit.

13. A system comprising:
an integrated circuit comprising a voting circuit that is configured to:
receive a plurality of redundant copies of a signal input; and remedy faults in a transmission pathway of the signal input by producing a signal output that reflects a majority among received versions of the plurality of redundant copies of the signal input, wherein the voting circuit remedies faults in a cross-layer connection between adjacent layers of the integrated circuit; and a physical memory that stores an output of the integrated circuit.

14. The system of claim 13, wherein the integrated circuit comprises a three-dimensional integrated circuit.

15. The system of claim 14, wherein the voting circuit is positioned adjacent to a through-silicon via (TSV) and remedies faults in the TSV.

16. The system of claim 14, wherein the voting circuit is positioned adjacent to a cross-layer connection between adjacent layers of the three-dimensional integrated circuit and remedies faults in the cross-layer connection.

17. The system of claim 13, wherein the plurality of redundant copies comprises three redundant copies of the signal input.

18. The system of claim 17, wherein the voting circuit comprises:

a first layer comprising three NAND gates that receive sub-combinations of the three redundant copies of the signal input as inputs according to an AB, BC, AC scheme;

a second layer comprising one NAND gate that receives the outputs of the first layer as an input; and an output that outputs a result of the voting circuit.

19. The system of claim 13, wherein the signal input is transmitted before the integrated circuit loads fuse data.

20. A method comprising:

transmitting, from a source logic unit, a plurality of redundant copies of a signal input to a voting circuit that is configured to:

receive the plurality of redundant copies of the signal input; and remedy electrical faults in a transmission pathway of the signal input by producing a signal output that reflects a majority among received versions of the plurality of redundant copies of the signal input, wherein the voting circuit remedies faults in a cross-layer connection between adjacent layers of the source logic unit; and receiving, at a destination logic unit, the signal output from the voting circuit.

* * * * *